US009397135B2

United States Patent
Sze

(10) Patent No.: US 9,397,135 B2
(45) Date of Patent: Jul. 19, 2016

(54) ACTIVE PIXEL SENSOR HAVING A RAISED SOURCE/DRAIN

(71) Applicant: Taiwan Semiconductor Manufacturing Co. Ltd., Hsin-Chu (TW)

(72) Inventor: Jhy-Jyi Sze, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/833,405

(22) Filed: Aug. 24, 2015

(65) Prior Publication Data

US 2015/0364519 A1    Dec. 17, 2015

Related U.S. Application Data

(63) Continuation of application No. 13/795,519, filed on Mar. 12, 2013, now Pat. No. 9,287,313.

(51) Int. Cl.
*H01L 27/146* (2006.01)
*H01L 29/08* (2006.01)
*H01L 29/417* (2006.01)

(52) U.S. Cl.
CPC .... *H01L 27/14643* (2013.01); *H01L 27/14612* (2013.01); *H01L 27/14616* (2013.01); *H01L 27/14689* (2013.01); *H01L 29/0847* (2013.01); *H01L 29/41783* (2013.01)

(58) Field of Classification Search
CPC ............ H01L 27/146; H01L 27/14609; H01L 27/14612; H01L 27/14636; H01L 27/14643
See application file for complete search history.

(56) References Cited

U.S. PATENT DOCUMENTS

| 5,804,846 | A  | 9/1998 | Fuller |
| 5,915,185 | A  | 6/1999 | Fratin et al. |
| 6,150,267 | A  | 11/2000 | Chen |
| 6,235,595 | B1 | 5/2001 | Sze |
| 6,303,449 | B1 | 10/2001 | Pan et al. |
| 6,566,208 | B2 | 5/2003 | Pan et al. |
| 6,606,120 | B1 | 8/2003 | Merrill et al. |
| 6,808,982 | B2 | 10/2004 | Parekh et al. |
| 6,847,051 | B2 | 1/2005 | Hong |
| 7,348,651 | B2 | 3/2008 | Yaung |
| 7,737,479 | B2 | 6/2010 | Wen et al. |

(Continued)

FOREIGN PATENT DOCUMENTS

| TW | 200404371 A | 3/2004 |
| TW | 200820430 A | 5/2008 |

OTHER PUBLICATIONS

Non-Final Office Action dated Dec. 1, 2014 for U.S. Appl. No. 13/795,519.

(Continued)

*Primary Examiner* — Jae Lee
(74) *Attorney, Agent, or Firm* — Eschweiler & Associates, LLC

(57) ABSTRACT

An integrated circuit having an array of APS cells. Each cell in the array has at least one transistor source or drain region that is raised relative to a channel region formed in a semiconductor substrate. The raised source or drain region includes doped polysilicon deposited on the surface of the semiconductor body and a region of the body extending to the channel region that has been doped to an opposite doping type from that of the channel region by diffusion of dopants from the deposited polysilicon.

20 Claims, 8 Drawing Sheets

(56) References Cited

U.S. PATENT DOCUMENTS

| | | |
|---|---|---|
| 7,776,676 B2 | 8/2010 | Sze |
| 8,217,437 B2 | 7/2012 | Hynecek |
| 2004/0033668 A1 | 2/2004 | Cha et al. |
| 2004/0211987 A1 | 10/2004 | Chien et al. |
| 2004/0232456 A1 | 11/2004 | Hong |
| 2005/0158897 A1 | 7/2005 | Sze et al. |
| 2006/0175641 A1 | 8/2006 | Mouli |
| 2006/0192261 A1 | 8/2006 | Sze et al. |
| 2008/0035968 A1 | 2/2008 | Sze |
| 2008/0277710 A1* | 11/2008 | Kim ............... H01L 27/105 257/309 |
| 2009/0162971 A1 | 6/2009 | Sze et al. |
| 2009/0261393 A1 | 10/2009 | Sze |
| 2012/0292664 A1 | 11/2012 | Kanike |

OTHER PUBLICATIONS

Final Office Action dated Mar. 6, 2015 for U.S. Appl. No. 13/795,519.

* cited by examiner

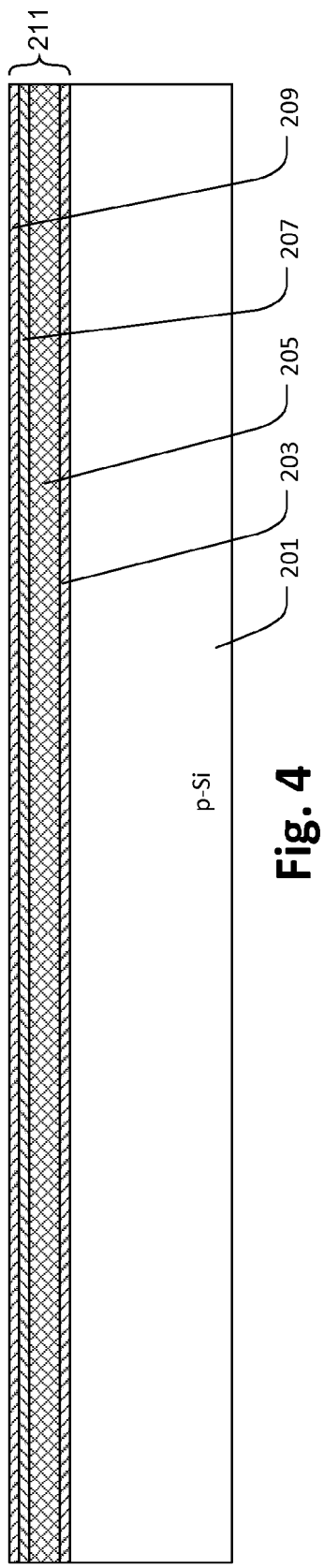
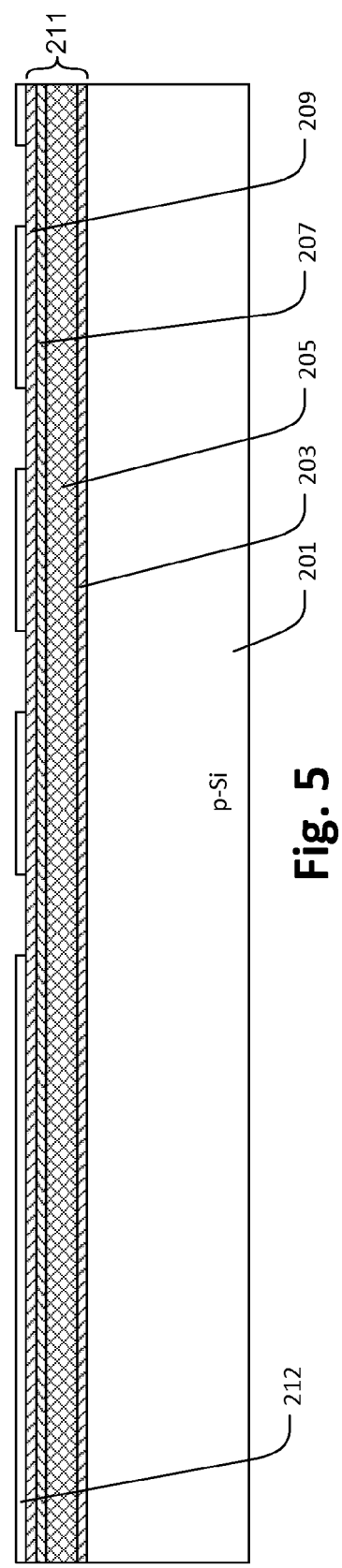

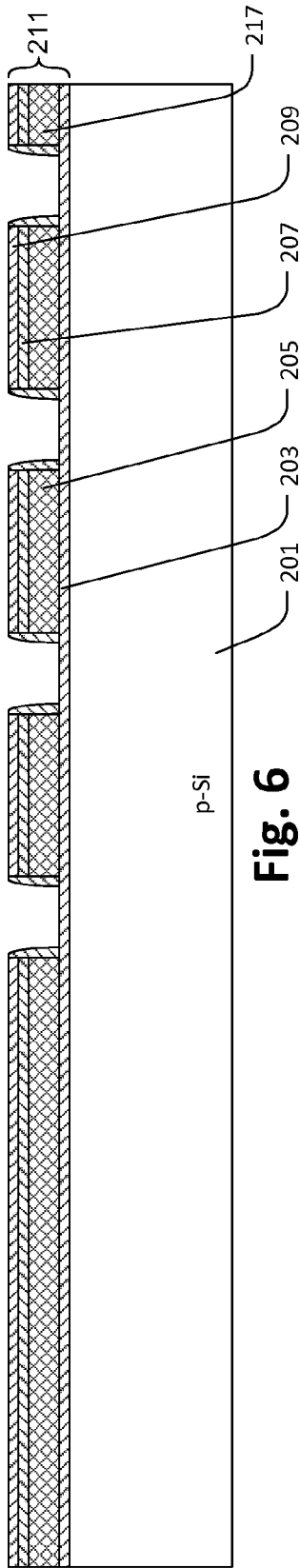
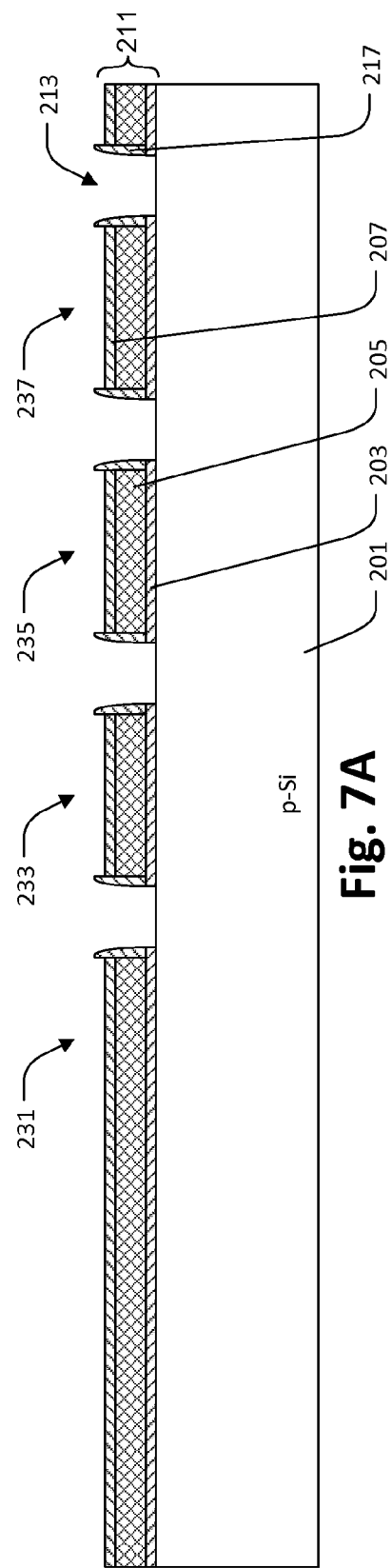

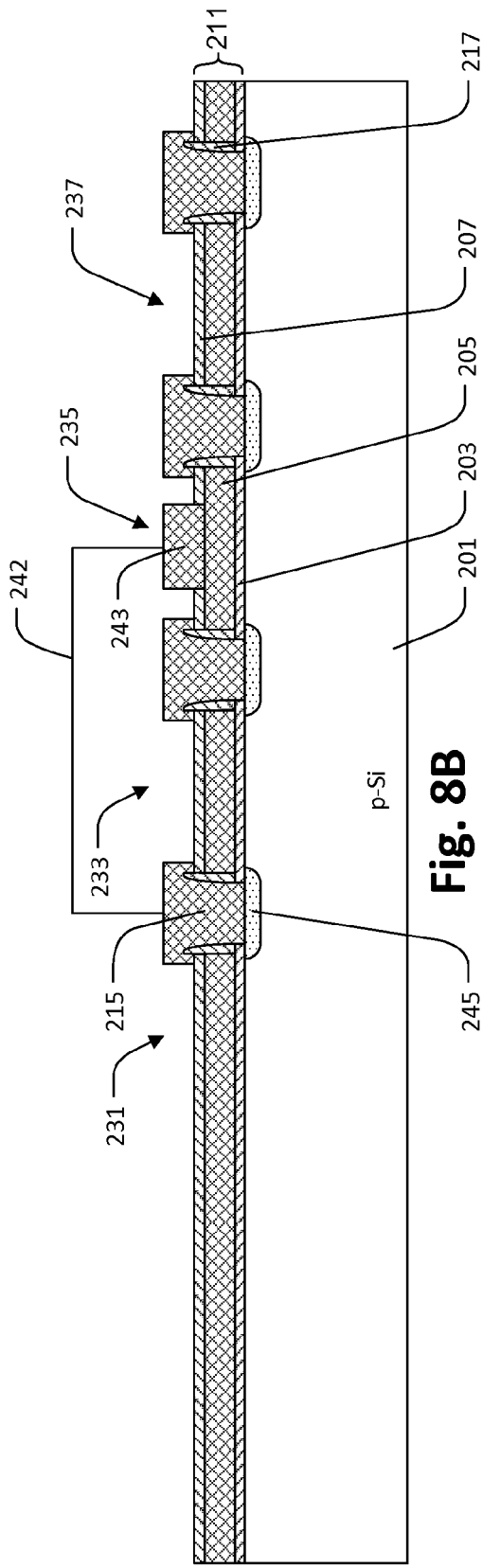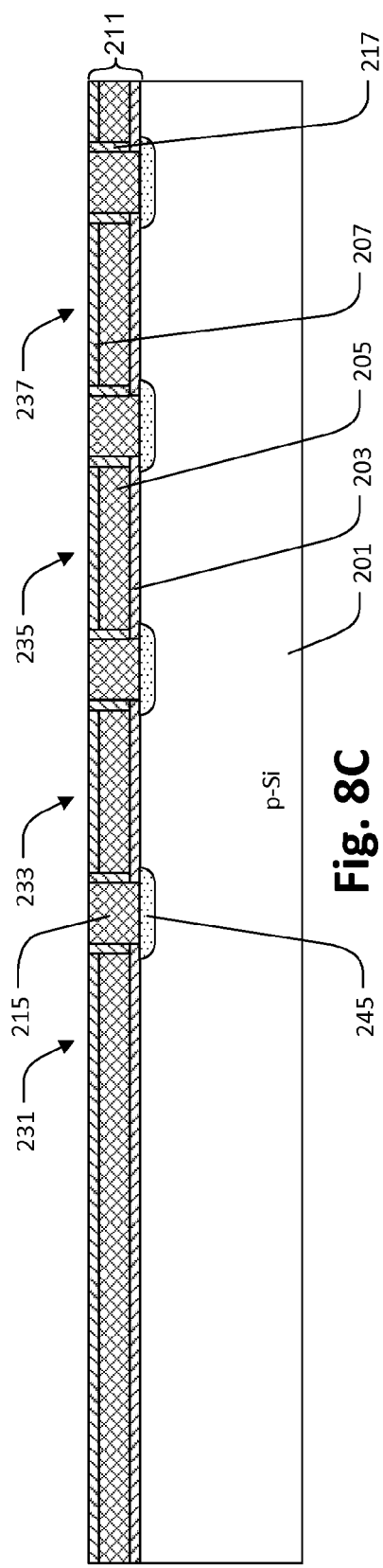

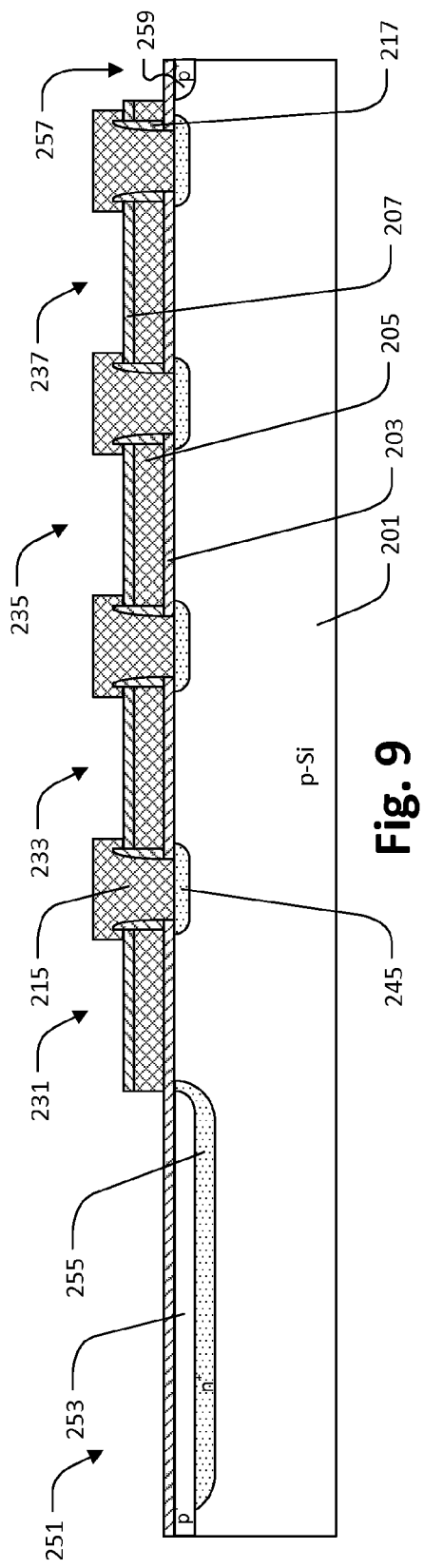
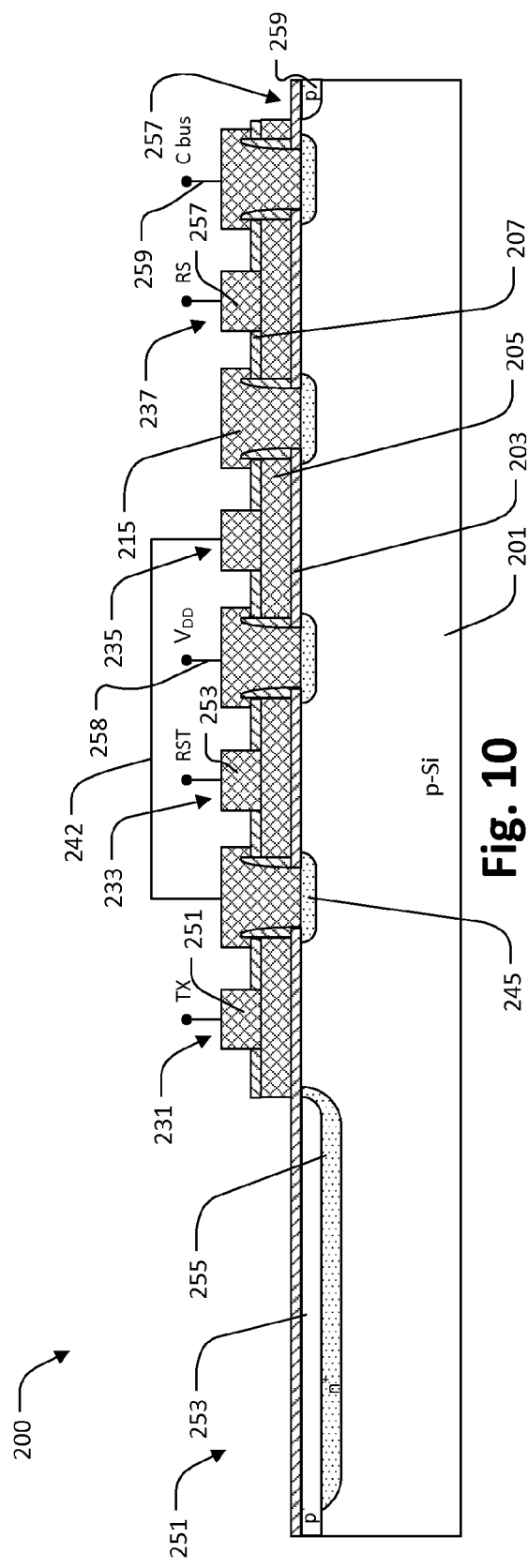

_US 9,397,135 B2_

ACTIVE PIXEL SENSOR HAVING A RAISED SOURCE/DRAIN

REFERENCE TO RELATED APPLICATION

This Application is a continuation of U.S. application Ser. No. 13/795,519 filed on Mar. 12, 2013, the contents of which are incorporated by reference in their entirety.

FIELD

The present disclosure provides active pixel sensors cells for integrated circuit devices and methods for their manufacture.

BACKGROUND

Integrated circuits (IC) with image sensors are used in PC cameras and cell phones, for example. Complementary metal-oxide semiconductor (CMOS) devices have become popular IC image sensors, largely replacing charge-coupled devices (CCD). CMOS image sensors include passive pixel sensors (PPS) and active pixel sensors (APS). An APS includes at least one photodiode and an amplifier within each cell of the pixel array. The amplifier can be configured as a source follower driven by the pixel itself.

SUMMARY

The present disclosure provides an integrated circuit having an array of APS cells. Each cell in the array has at least one transistor source or drain region that is raised relative to a channel region formed in the semiconductor body. The raised source or drain region include doped polysilicon on the surface of the semiconductor body. A region of the semiconductor body that has been doped to an opposite doping type of the channel region by diffusion of dopants from the doped polysilicon extends the source or drain from the doped polysilicon to border the channel region.

The present disclosure also provides methods of forming integrated circuits having APS cells with raised source or drain regions. In these methods, a gate stack is formed over a semiconductor body. The gate stack includes a dielectric layer and a conductive layer. Openings are formed through the gate stack exposing the substrate surface underneath. The openings are then filled with doped polysilicon. Thermal annealing diffuses some of the dopants into the semiconductor body. The diffusion doped substrate and the doped polysilicon form a raised source/drain area for a least one transistor in each cell in an array of CMOS APS cells.

In one embodiment, the openings in the gate stack are formed by a dry-by-wet etch process. The dry-by-wet etch process removes the polysilicon of the gate stack by a dry etch process. The dry etch process uses the dielectric layer as an etch stop. Spacers are formed lining the sides of the opening formed by the dry etch process. A wet etch process is then used to extend the openings through the gate dielectric and expose the semiconductor body surface underneath. The spacers separate the raised source/drains from the gate electrodes.

The primary purpose of this summary has been to present certain of the inventor's concepts in a simplified form to facilitate understanding of the more detailed description that follows. This summary is not a comprehensive description of every one of the inventor's concepts or every combination of the inventor's concepts that can be considered "invention". Other concepts of the inventor will be conveyed to one of ordinary skill in the art by the following detailed description together with the drawings. The specifics disclosed herein may be generalized, narrowed, and combined in various ways with the ultimate statement of what the inventor claims as his invention being reserved for the claims that follow.

BRIEF DESCRIPTION OF THE DRAWINGS

FIGS. 4-10 illustrate an example 4T APS cell provided by the present disclosure at various stages of manufacture in accordance with one embodiment.

DETAILED DESCRIPTION

Figure 1:
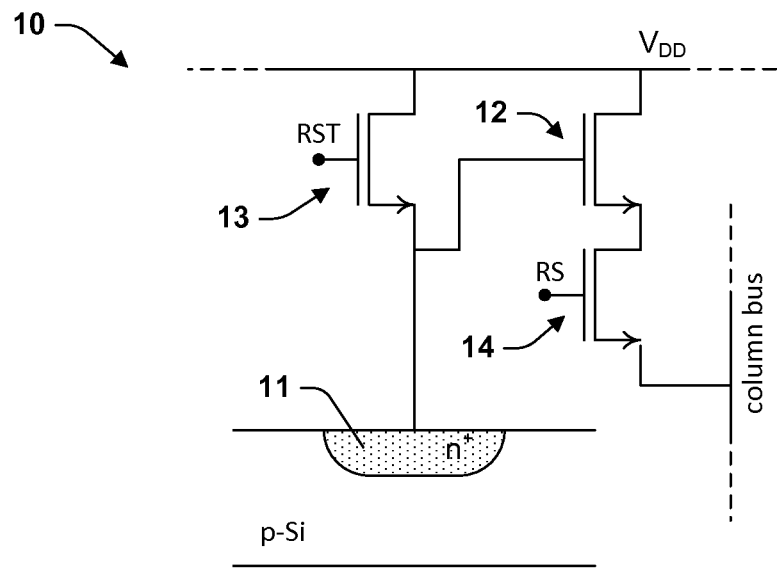
FIG. 1 is a circuit diagram for a 3T APS cell.

FIG. 1 provides a circuit diagram of an example APS cell 10 of the three transistor (3-T) variety according to one embodiment. Exposure to light causes charges to accumulate in the photodiode 11. The charge level is detected by the source follower 12. The transistor 13 is used reset the photodiode 11 between exposure periods. The row select transistor 14 is used for addressing.

Figure 2:
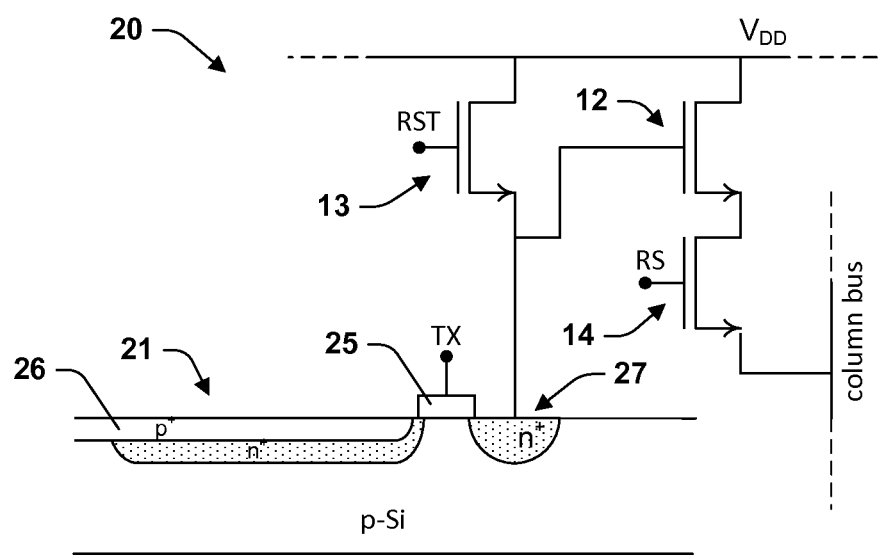
FIG. 2 is a circuit diagram for a 4T APS cell.

FIG. 2 provides a circuit diagram of an example APS cell 20 of the four transistor (4-T) variety according to one embodiment. Similar to the 3-T cell 10, the 4-T cell 20 includes a reset transistor 13 and a row select transistor 14. The 4-T cell 20 includes a pinned photodiode 21. Charge transport from the pinned photodiode 21 is initiated by pulsing a transfer gate transistor 25. The pinning implant 26 drives charge collected in the photodiode 21 to the floating node 27. The charge level in the floating node 27 is detected by the source follower 12.

Figure 3:
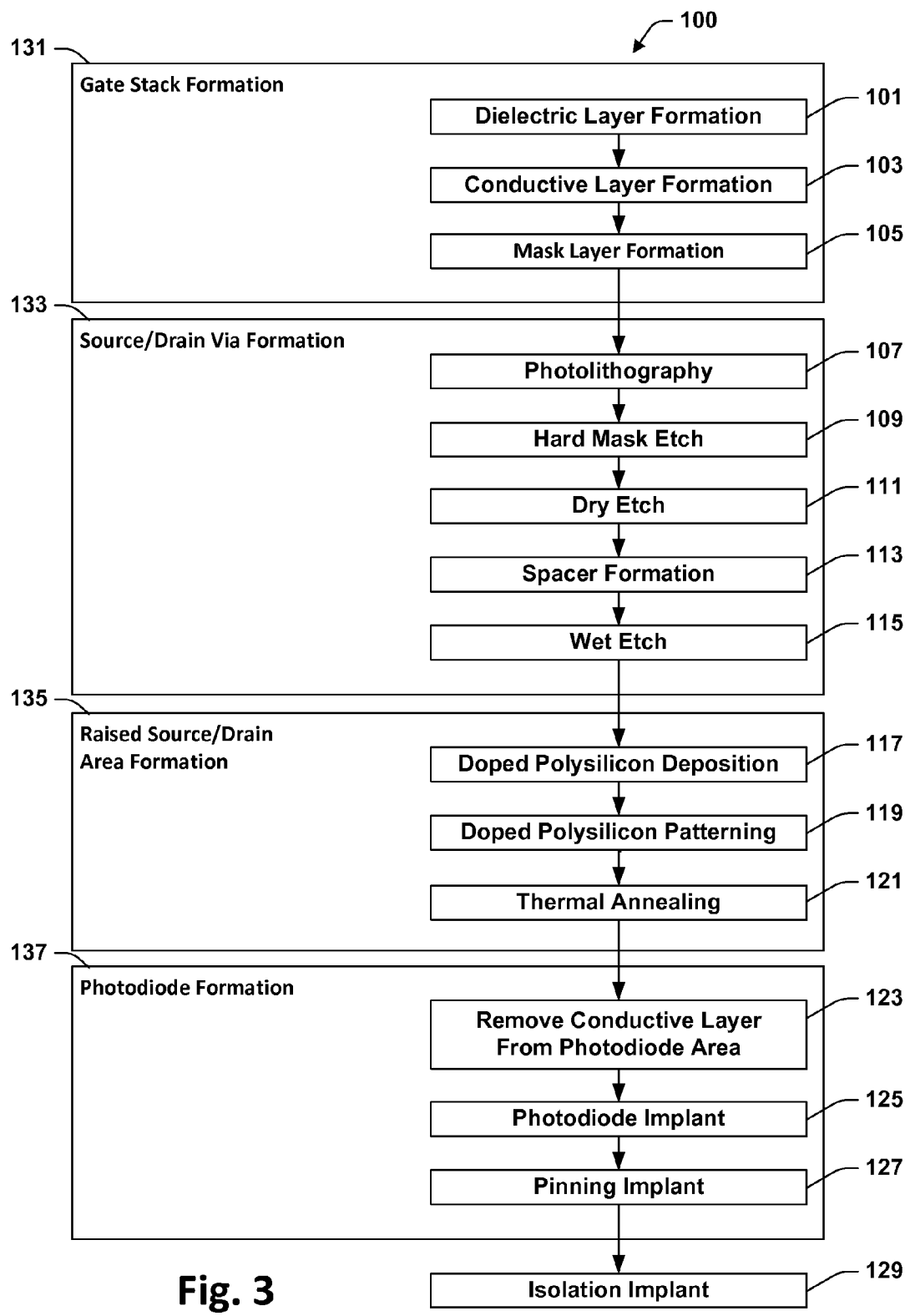
FIG. 3 is a flow chart of an example process for forming IC devices having CMOS APS cells with raised source/drain regions in accordance with one embodiment.

FIG. 3 is a flow chart of a process 100 for forming IC devices having CMOS APS cells with raised source/drain regions according to one embodiment. FIGS. 4-10 illustrate an example embodiment of this process providing an APS cell 200 of the 4T-type on a semiconductor substrate 201 according to one embodiment.

In the example embodiment, the substrate 201 is single crystal silicon lightly p-doped in the region where the APS cell 200 is formed. Instead of silicon, the semiconductor can be of another suitable type such as Ge, SiC, GaAs, GaAlAs, InP, GaN, and SiGe. In an alternate embodiment, the semiconductor substrate 201 is of the silicon-on-insulator (SOI) type.

The process 100 begins with a series of actions 131 that form a gate stack 211 on the semiconductor substrate 201 as illustrated in FIG. 4. Actions 131 include act 101, forming a dielectric layer 203, act 103, forming a conductive layer 205, and act 105, forming a hard mask layer 207 and 209.

In the example embodiment, the dielectric layer 203 is $SiO_2$. Other dielectrics can also be used. In an alternative embodiment, the dielectric is a high-k dielectric. A high-k dielectric is one having a conductivity at least 5 times that of silicon dioxide, for example. Examples of high-k dielectrics include hafnium-based materials such as $HfO_2$, HfSiO, HfSiON, HfTaO, HfTiO, HfZrO, and $HfO_2$—$Al_2O_3$ alloy. Additional examples of high-k dielectrics include, without limitation, $ZrO_2$, $Ta_2O_5$, $Al_2O_3$, $Y_2O_3$, $La_2O_3$, and $SrTiO_3$.

In the example embodiment, the conductive layer 205 is polysilicon. Other conductors can be used instead. The conductive layer 205 can also be made up of multiple layers of various materials. In an alternative embodiment, the conductive layer 205 is one or more metal layers. A metal layer 205 generally includes at least one layer of Ti, TiN, TaN, Ta, TaC, TaSiN, W, WN, MoN, and MoON. Additional examples of materials for conductive metal layers include ruthenium, palladium, platinum, cobalt, nickel, hafnium, zirconium, titanium, tantalum, aluminum, and conductive carbides, oxides, and alloys of these metals.

In the example embodiment, the hard mask layer includes two layers, a silicon nitride layer 207 and a silicon dioxide layer 209. Other hard mask materials can be used instead. There can be only one hard mask layer 207 or 209, or even no hard mask depending on the process used to pattern the gate stack 211.

The process 100 of FIG. 3 continues with a series of actions 133 that pattern the gate stack 211 forming vias 213. The first act 107 forms a patterned mask 212 over the gate stack 211 as illustrated in FIG. 5. The patterned mask 212 is formed by photolithography or any other suitable process. The pattern of the mask 212 is transferred to the hard mask (207 and 209) in act 109, and then the rest of the gate stack 211.

In one embodiment, the gate stack 211 is etched according to a dry-by-wet etch process. A dry-by-wet etch process uses a dry etch process 111 to etch through the conductive layer 205 and a wet etch process 115 to etch through the dielectric layer 203. The dry etch process 111 is selective for removing the material of the conductive layer 205, which is generally polysilicon, over material of the dielectric layer 203, which is generally silicon dioxide. The dry etch process 111 is generally a plasma etch for which the dielectric layer 203 provides an etch process. The wet etch process 115 is selective for removing material of the dielectric layer 203 in comparison to the material of the substrate 201. The dry-by-wet etch process exposes the silicon substrate 201 through the vias 213, thoroughly removing the dielectric layer 203 from those locations while minimizing penetration of the vias 213 into the substrate 201. This facilitates the formation of shallow junctions as will be discussed later.

In a more narrow embodiment, the dry-by-wet etch process includes the act 113, which is forming sidewall spacers 217 within the vias 213 as illustrated in FIG. 6. In this embodiment, the act 113 comes after the dry etch 111 but before the wet etch 115. Forming the sidewall spacers 217 includes filling the vias 213 with the spacer material 217 and then anisotropically etching to remove the spacer material 217 from all but the sidewalls of the vias 213. Forming the spacers 217 prior to the wet etch 115 allows the spacers to protect the gate stack 211 from damage during the subsequent wet etch 115.

The wet etch 115 removes the hard mask layer 209 on top of the gate stack 211 while extending vias 213 through the dielectric layer 203, producing the structure shown in FIG. 7A. Actions 133 begin to define and separate the gate electrodes for the transistors 231, 233, 235, and 237 at the locations identified in FIG. 7A. In one embodiment transistor 231 will be a transfer gate 25, transistor 233 will be a reset transistor 13, transistor 235 will be a source follower 12, and transistor 237 will be a row select transistor 14. In other embodiments, not all the transistors in such a cell need be formed by this process.

Figure 8A:
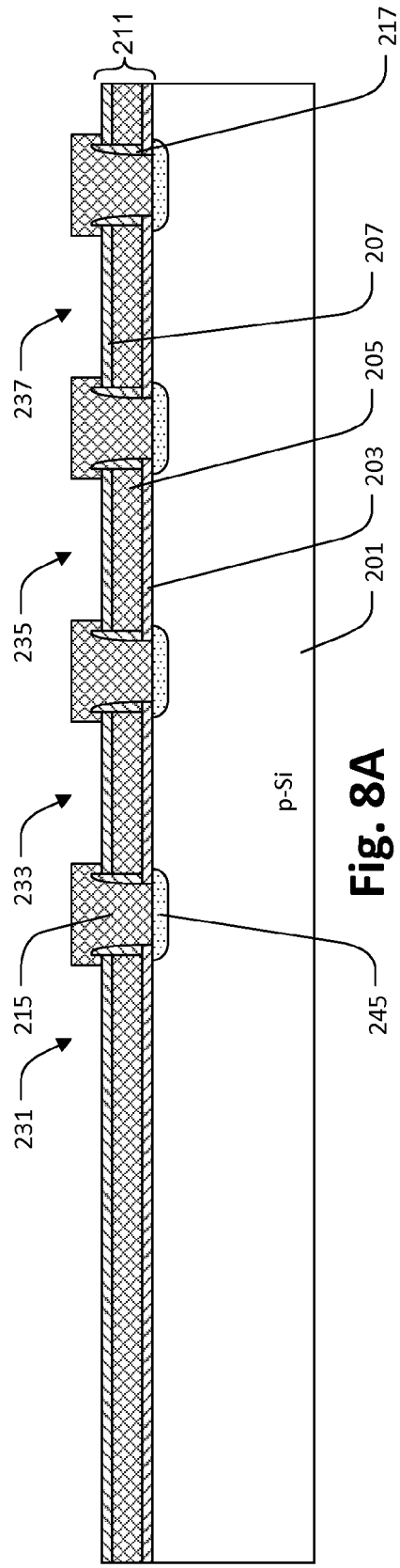

The process 100 continues with a series of actions 135 that deposit doped polysilicon to form raised source/drain areas 215 as illustrated in FIG. 8A. In one embodiment, the resultant raised source/drain areas 215 may have a dopant concentration range of about $1 \times 10^{19}$-$8 \times 10^{29}/cm^3$. A source/drain can be a source, a drain, or both a source and a drain. The actions 135 including act 117, depositing doped polysilicon, act 119, patterning the doped polysilicon, and act 121, thermal annealing. The doped polysilicon fills the vias 213. Its doping type is opposite that of the substrate 201 in the channel regions for the transistors 231, 233, 235, and 237. The doped polysilicon can be deposited across the entire substrate using a chemical vapor deposition (CVD) process, for example, or selectively within the vias 213 using an epitaxial growth process. After deposition, act 119 patterns the doped polysilicon using a lithographic process. In the example embodiment, patterning removes the doped polysilicon from all locations except where it forms the raised source/drain areas 215.

Thermal annealing 121 causes dopant from the doped polysilicon in the raised source/drain areas 215 to diffuse into the substrate 201 to create source/drain regions 245. In one embodiment, the dopant concentration of the resultant shallow junctions in the substrate 201 has a range of about $1 \times 10^{18}$-$5 \times 10^{29}/cm^3$. Diffusion reverses the doping type of the substrate 201 in the source/drain regions 245 and creates very shallow junctions for the transistors 231, 233, 235, and 237. The pattern of diffusion from the raised source/drain areas 215 defines the shape of the source/drain regions 245, an n-doped area of substrate 201 in this example.

A raised source/drain is a transistor source/drain at least part of which is elevated with respect to the channel region or the substrate surface of the transistor. The source/drain areas illustrated by the figures include both the raised source/drain areas 215 and the source/drain regions 245 that are doped $n^+$ by diffusion.

The thermal annealing 121 can be carried out at any time after act 111, depositing the doped polysilicon. In one embodiment the resultant junction depth has a range of about 50 nm to about 150 nm. The annealing should be rapid to keep the junctions very shallow in one embodiment. A very shallow junction has a depth of 100 nm or less. Shallow junctions are also facilitated by having spacers 217 be very narrow. This keeps the raised source/drain areas 215 very close to the junctions. 50 nm or less would be considered very close.

Figure 7B:
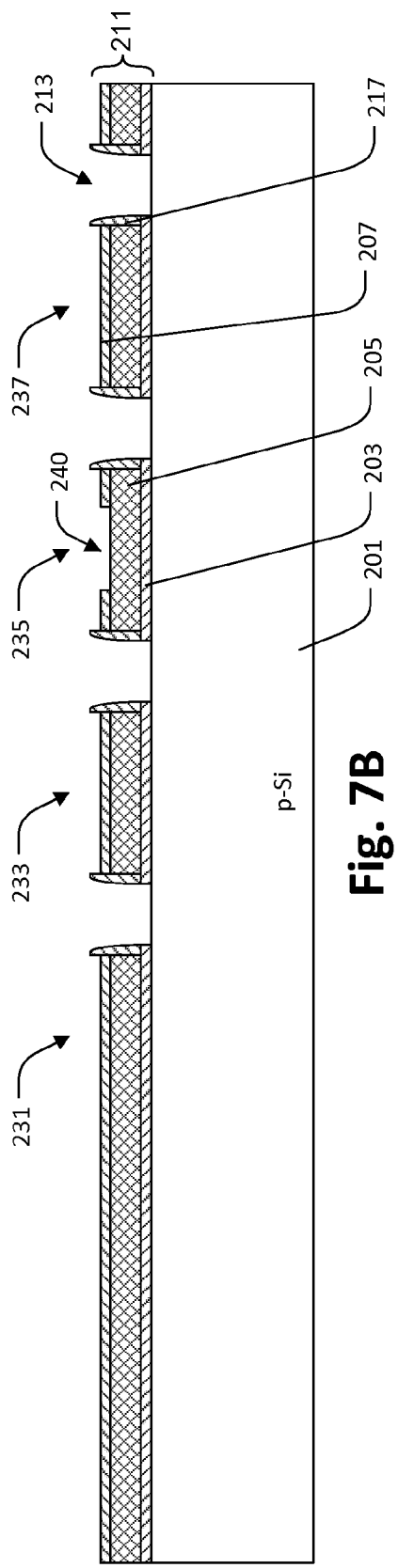

In an alternative embodiment, the doped polysilicon is patterned so that a portion 243 remains over the gate electrode of transistor 235 as show in FIG. 8B. In this alternative embodiment, a previous step etches through the mask layer 207 over the gate of transistor 235 forming an opening 240 as shown in FIG. 7B. In this way, the doped polysilicon 243 contacts the gate electrode of transistor 235. The doped polysilicon 235 is continuous with the doped polysilicon 215 of the raised source/drain shared by the transfer gate 231 and the reset transistor 233. The connection 242 is made outside the plane of FIG. 8B and becomes a buried contact line.

In another alternative embodiment act 119, patterning the doped polysilicon by a lithographic process, is replaced by chemical mechanical planarization (CMP). This removes the doped polysilicon from areas outside the vias 213 and produces the raised source/drain areas 215 as illustrated in FIG. 8C. This embodiment saves one mask in comparison to process 100. It should be understood that while the above process embodiment describes a traditional gate type process flow, alternatively, a replacement gate type process may be employed with a dummy gate that is subsequently removed and replaced with a replacement gate material, such as a metal, according to one embodiment of the disclosure.

The process 100 continues with a series of actions 137 that form a photodiode 251 as illustrated by FIG. 9. The actions 137 include act 123, removing the conductive layer 205 from the photodiode area 251, act 125, forming the photodiode implant 255, and act 127, forming the pinning implant 253.

Act 123 is a lithographic process. In one embodiment, act 123 also removes the conductive layer 205 from areas 257, which are areas between cells in the photodiode array. This prepares the areas 257 to receive an isolation implant in act 129.

Act 125 reverses the doping type within the area 255 of the substrate 201 and thereby creates a p-n junction between the area 255 and the adjacent area of substrate 201. This p-n junction provides the light capturing of the photodiode 251. Act 127 is a shallower implant of a different type that again reverses the doping type with the substrate area 253.

After the photodiode is formed, the process 100 continues with act 129, forming the isolation implant 259. This is a heavy implant that is reverse in type from that of the source/drain areas 215 and provides full junction isolation. In one embodiment, this isolation implant is combined with act 127, the pinning implant, to save an action. The implants 259 isolate the cells of the photodiode array and eliminate the need for shallow trench isolation (STI) or field oxide areas in the region of the photodiode array. Accordingly, in one embodiment the array is characterized by the absence of either shallow trench isolation areas of field oxide between the cells in the array.

Process 100 is followed by conventional actions to form the contacts illustrated by FIG. 10 and additional process to complete formation of the integrated circuit device 200. The contacts include a gate contact 254 for actuating the transfer gate 231, a gate contact 256 for actuating the reset transistor 233, a source/drain contact 258 to connect the source/drain region 215 shared by the transistor 233 and the source follower 235 to supply voltage $V_{DD}$, a gate contact 257 for actuating the row select transistor 237, and a source/drain contact 259 to connect a source/drain region 215 of the row select transistor 237 to a column bus. Additional contacts are used to provide the connection 242 between the floating node and the gate of the source follower 235, unless this connection has already been made by a buried contact line 242 as in the embodiment of FIG. 8A. The floating node corresponds to the source/drain region 215 shared by the transfer gate 231 and the reset transistor 233.

Figure 11:
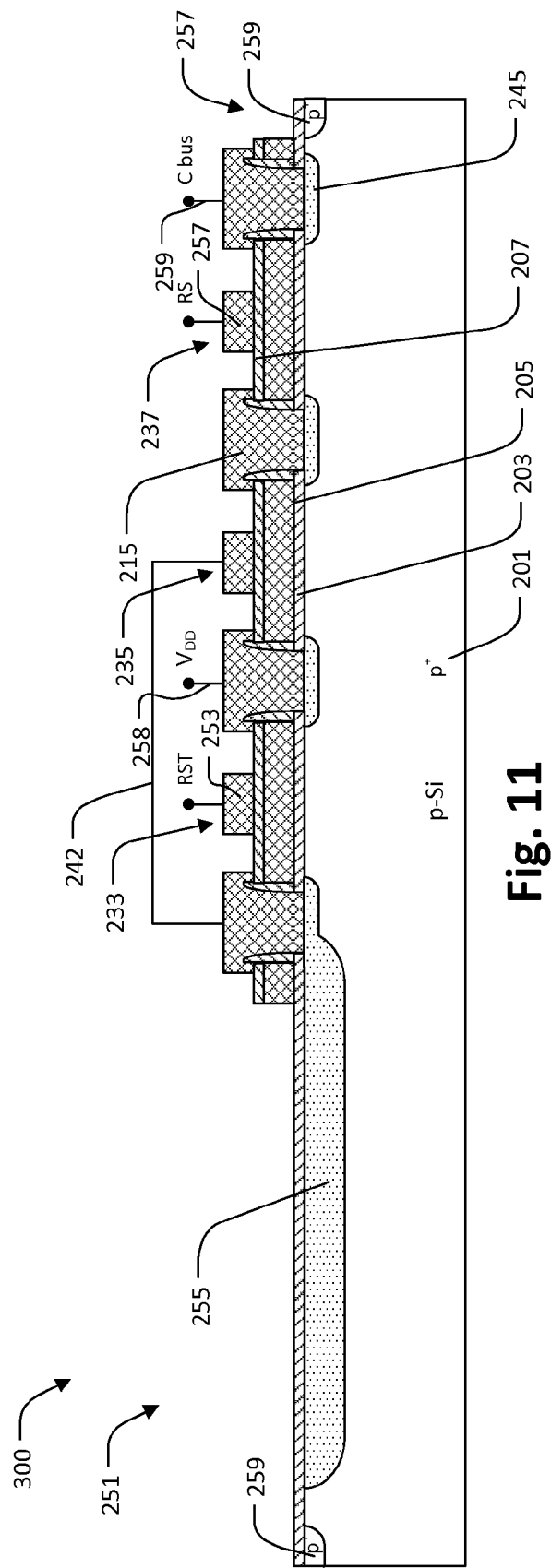
FIG. 11 illustrates an example 3T APS cell provided by the present disclosure in accordance with one embodiment.

FIG. 11 provides an example of an APS cell 300, which is similar to the APS 200 except that it is an example embodiment providing an APS cell of the 3-T type. The APS cell 300 can be produced with by the process 100 with minor modifications.

The present disclosure helps to overcome a heretofore design trade-off in source/drain junction depth and junction isolation size. In such instance, shallow source/drain junctions are desired, however, with source/drain silicon loss due to contact etching, such silicon loss resulted in leakage, thus requiring an increase in source/drain junction depth. By increasing source/drain junction depth, a deeper junction isolation implant is needed with sufficient width to ensure adequate device-to-device isolation, which results disadvantageously increased device area. By forming raised source/drain regions that form source/drain regions in the semiconductor body via diffusion, shallow junctions are achieved in the semiconductor body without such leakage, thereby allowing junction isolation requirements to be relaxed and thus reducing area.

In accordance with conventional solutions, leakage on the order of about 0.1 pA-1 nA existed. In accordance with various embodiments of the present disclosure, the leakage is reduced advantageously to an amount in the range of about 1fA-tens of fA.

In other embodiments, the present disclosure relates to a device, comprising a gate stack comprising a dielectric layer and a conductive layer positioned over a semiconductor body. The device further comprises a raised source or drain region having a sidewall in contact with the dielectric layer, wherein the raised source or drain region is doped with an opposite doping type of the semiconductor body. The device further comprises a sidewall spacer located vertically over the dielectric layer and laterally between the gate stack and the raised source or drain region In other embodiments, the present disclosure relates to a transistor, comprising a gate stack comprising a dielectric layer and a conductive layer positioned over a channel region of a semiconductor body. The transistor further comprises a raised source or drain region disposed at a position laterally adjacent to the channel region, wherein the raised source or drain region is doped with an opposite doping type of the channel region and is positioned over and in contact with a source or drain region disposed within the semiconductor body. The transistor further comprises a sidewall spacer located between the gate stack and the raised source or drain region.

In yet other embodiments, the present disclosure relates to a transistor, comprising a dielectric layer positioned over a channel region of a semiconductor body, and a conductive layer positioned over the dielectric layer. The transistor further comprises a raised source or drain region positioned over and in contact with a source or drain region within the semiconductor body. The transistor further comprises a sidewall spacer located between and in contact with both the conductive layer and the raised source or drain region. The transistor further comprises a gate contact positioned over and in contact with the conductive layer.

The disclosure as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one invention and the following claims do not necessarily encompass every concept, aspect, embodiment, or example described herein.

The invention claimed is:

1. A device, comprising:
    a gate stack comprising a dielectric layer and a conductive layer positioned over a semiconductor body;
    a raised source or drain region having a sidewall in contact with the dielectric layer, wherein the raised source or drain region is doped with an opposite doping type of the semiconductor body;
    a sidewall spacer located vertically over the dielectric layer and laterally between the gate stack and the raised source or drain region; and
    a photodiode implantation area arranged within the semiconductor body at a location laterally offset from the gate stack, wherein the photodiode implantation area has a doping type that is different than that of the semiconductor body abutting the photodiode implantation area.

2. The device of claim 1, wherein the raised source or drain region is positioned over a source or drain region disposed within the semiconductor body.

3. The device of claim 1, wherein the dielectric layer continuously extends along an upper surface of the semiconductor body from below the gate stack to over the photodiode implantation area.

4. The device of claim 3, further comprising:
a pinned implantation area, having a different doping type than the photodiode implantation area, wherein the pinned implantation area is vertically arranged between the photodiode implantation area and the dielectric layer.

5. The device of claim 1, further comprising:
a first highly p-doped region arranged within the semiconductor body on an opposite side of the photodiode implantation area as the gate stack.

6. The device of claim 5, further comprising:
a second highly p-doped region arranged within the semiconductor body on an opposite side of the gate stack as the photodiode implantation area.

7. The device of claim 1, wherein the photodiode implantation area is laterally separated from the raised source or raised drain by the gate stack.

8. The device of claim 1, wherein the raised source or drain region vertically extend through the dielectric layer.

9. The device of claim 1, further comprising:
a second gate stack laterally separated from first gate stack by the raised source or drain region, and comprising a second dielectric layer and a second conductive layer positioned over the semiconductor body; and
wherein the raised source or drain region is electrically coupled to a gate contact directly overlying the second gate stack.

10. A transistor, comprising:
a gate stack comprising a dielectric layer and a conductive layer positioned over a channel region of a semiconductor body;
a raised source or drain region disposed at a position laterally adjacent to the channel region, wherein the raised source or drain region is doped with an opposite doping type of the channel region and is positioned over and in contact with a source or drain region disposed within the semiconductor body;
a sidewall spacer located between the gate stack and the raised source or drain region; and
wherein the sidewall spacer extends to a position that is embedded within the raised source or drain region.

11. The transistor of claim 10, further comprising:
a photodiode implantation area arranged within the semiconductor body at a location laterally offset from the gate stack, wherein the photodiode implantation area has a doping type that is different than that of the semiconductor body abutting the photodiode implantation area.

12. The transistor of claim 11, wherein the dielectric layer continuously extends along an upper surface of the semiconductor body from below the gate stack to over the photodiode implantation area.

13. The transistor of claim 10, further comprising:
a gate contact positioned over the conductive layer.

14. The transistor of claim 13, wherein the gate contact directly contacts an upper surface of the conductive layer.

15. A transistor, comprising:
a dielectric layer positioned over a channel region of a semiconductor body;
a conductive layer positioned over the dielectric layer;
a raised source or drain region positioned over and in contact with a source or drain region within the semiconductor body;
a sidewall spacer located between and in contact with both the conductive layer and the raised source or drain region, wherein the sidewall spacer is positioned laterally adjacent to the conductive layer and in contact with an upper surface of the dielectric layer; and
a gate contact positioned over and in contact with the conductive layer.

16. The transistor of claim 15, further comprising:
a photodiode implantation area arranged within the semiconductor body at a location laterally offset from the conductive layer, wherein the photodiode implantation area has a doping type that is different than that of the semiconductor body abutting the photodiode implantation area.

17. The transistor of claim 16, wherein the dielectric layer continuously extends along an upper surface of the semiconductor body from below the conductive layer to over the photodiode implantation area.

18. The transistor of claim 15, wherein the gate contact is set back from sidewalls of the conductive layer.

19. The transistor of claim 15, further comprising:
a second dielectric layer positioned over a second channel region of the semiconductor body;
a second conductive layer positioned over the second dielectric layer; and
a second sidewall spacer located between and in contact with both the second conductive layer and the raised source or drain region.

20. The transistor of claim 16, further comprising:
a first isolation implantation region separated from the conductive layer by the photodiode implantation area, wherein the first isolation implantation region is disposed along an upper surface of the semiconductor body and below the dielectric layer; and
a second isolation implantation region separated from the photodiode implantation area by the conductive layer and the raised source or drain, wherein the second isolation implantation region is disposed along the upper surface of the semiconductor body and below the dielectric layer.

* * * * *